United States Patent [19]

Iga

[11] Patent Number: 5,065,241

[45] Date of Patent: Nov. 12, 1991

[54] GHOST CANCELLING SYSTEM THAT CANCELS GHOSTS FROM VIDEO SIGNALS WITH A TRANSVERSAL FILTER

[75] Inventor: Hiroyuki Iga, Kanagawa, Japan

[73] Assignee: Kabushiki Kaisha Toshiba, Kawasaki, Japan

[21] Appl. No.: 552,557

[22] Filed: Jul. 16, 1990

[30] Foreign Application Priority Data

Aug. 17, 1989 [JP] Japan .................................. 1-210634

[51] Int. Cl.⁵ ........................ H04N 9/64; H04N 5/14; H04N 5/208; H04N 5/213
[52] U.S. Cl. ................................... 358/166; 358/167; 358/36; 358/37
[58] Field of Search ................... 358/167, 166, 36, 37

[56] References Cited

U.S. PATENT DOCUMENTS

| | | | |
|---|---|---|---|
| 4,476,491 | 10/1984 | Murata et al. ...................... | 358/167 |
| 4,583,120 | 4/1986 | Murakami et al. .................. | 358/167 |
| 4,896,213 | 1/1990 | Kobo et al. ......................... | 358/167 |
| 4,897,725 | 1/1990 | Tanaka et al. ...................... | 358/167 |

FOREIGN PATENT DOCUMENTS 5343 2/1990 Japan .

OTHER PUBLICATIONS

Makino et al., "A Novel Automatic Ghost Canceller", IEEE Transaction on Consumer Electronics, vol. CE-26, No. 3, Aug. 1980, pp. 629-637.

*Primary Examiner*—James J. Groody
*Assistant Examiner*—Glen B. Burgess
*Attorney, Agent, or Firm*—Foley & Lardner

[57] ABSTRACT

A ghost cancelling system which distinguishes whether ghosts have been substantially cancelled from a video signal for finding an equilibrium condition. The system calculates a specified value which depends on the noise signal contained in the video signal. The tap coefficients which are equal or greater than the specified value are then detected, and the system corrects only those tap coefficients after the equilibrium condition exists.

15 Claims, 4 Drawing Sheets

GHOST CANCELLING SYSTEM THAT CANCELS GHOSTS FROM VIDEO SIGNALS WITH A TRANSVERSAL FILTER

BACKGROUND OF THE INVENTION

1. Field of the Invention

The present invention relates, in general, to a ghost cancelling system, and more particularly to a ghost cancelling system that cancels ghosts from video signals by using a transversal filter.

2. Description of the Related Art

Usually, in television image receivers, a ghost cancelling system is provided for cancelling ghosts from the received signal. This ghost cancelling system is usually designed to cancel ghosts using a transversal filter (hereafter, TF).

As an example, this type of ghost cancelling system is described in Japanese Patent Disclosure (Kokai) No. 59-211315. The conventional technique discloses that the system is designed as a feed-back construction ghost cancelling system. Specifically, the video signal inputted from the input terminal of the ghost cancelling system is supplied to a subtractor circuit after being converted to a digital signal by an A/D conversion circuit. The subtractor circuit outputs a video signal from which ghosts have been cancelled by subtracting from the output of the A/D conversion circuit a ghost cancelling signal outputted from the TF. The TF generates the ghost cancelling signal using the output of the subtractor circuit. The output of the subtractor circuit which is supplied to the TF is successively delayed every cycle T (e.g., 70 nsec) by the tapped delay line. Each delayed output is added in an adder circuit after the tap coefficients have been supplied by the coefficient circuit connected to the corresponding tap. This addition output is supplied to the subtractor circuit as the ghost cancelling signal. Furthermore, these tap coefficients are corrected every vertical synchronising cycle, based on a reference signal.

Accordingly, although a video signal containing a ghost is obtained from the subtractor circuit in the commencement stage of the waveform equalizing process (ghost cancelling process), a ghost-cancelled video signal can be obtained in the final stage of the waveform equalizing process. In general, the correction of the tap coefficients is performed by using a microprocessor in a conventional manner. For example, the detail techniques of correction are described in "Ghost Clean System", IEEE Trans. on CE. vol. CE-29, No. 3, Aug. 1983, by Murakami, Iga and Takehara and "Automatic Ghost Equalizer with Digital Processing", IEEE International Symposium on Circuits and Stems, 1983, by Shimbo, Yasumoto, Miyata and Shiotani.

In the ghost cancelling system described above, however, when the reference signal contains a noise signal, a gentle waveform change is more difficult to detect than a steep waveform change. Thus, the gentle waveform change will not be sufficiently cancelled in the tap coefficient correction. As a result, the undulations of the gentle waveform appear in the output signal.

SUMMARY OF THE INVENTION

Accordingly, it is an object of the present invention to provide an improved ghost cancelling system which reduces the flickering low band fluctuation caused by the noise signals which are added to the reference signal for ghost cancellation, without stopping the waveform equalizing loop.

It is a further object of the present invention to provide a ghost cancelling system which is capable of following the ghost phase fluctuation caused by any change in the weather.

In accordance with the present invention, the foregoing objects are achieved by providing, a ghost cancelling system includes a transversal filter having a plurality of tapped delay lines, coefficient circuits, an adder and a tap coefficient memory, wherein the tapped delay lines operate as an input portion of the transversal filter and delay the input signal by a specified delay time, the tap coefficient memory maintains the value of each tap coefficient corresponding to the tapped delay lines, the coefficient circuits are connected to the corresponding delay lines and amplify the delayed output signal by the tap coefficients, and the adder sums the amplified output signals from the coefficient circuits and operates as an output portion of the transversal filter. A subtractor subtracts the summed signal output from the output portion of the transversal filter from an input video signal containing a vertical synchronization cyclic reference signal and outputs the result of the subtraction operation to the input portion of the transversal filter. A memory device maintains the waveform of the video signal output from the subtractor. An error detector compares the video signal maintained in the memory device and a reference signal. A control device controls the correction of the tap coefficients in response to an output from the error detector. The control device includes, a judging device for judging whether an equilibrium condition exists wherein the ghost has been substantially cancelled from the video signal, a detecting device for detecting the tap coefficients, whose value exceeds a specified level, a correcting device for correcting the each tap coefficient until the equilibrium condition is reached but correcting only those tap coefficients detected by the detecting device after the equilibrium condition is reached, an output device for outputting the corrected tap coefficients to the tap coefficient memory in the transversal filter.

BRIEF DESCRIPTION OF THE DRAWINGS

These and other objects and advantages of this invention will become more apparent from the following detailed description of the presently preferred embodiment of the invention, taken in conjunction with the accompanying drawings of which.

DETAILED DESCRIPTION OF THE PREFERRED EMBODIMENT

. The preferred embodiment of the present invention will now be described in more detail with reference to the accompanying drawings.

Figure 1:
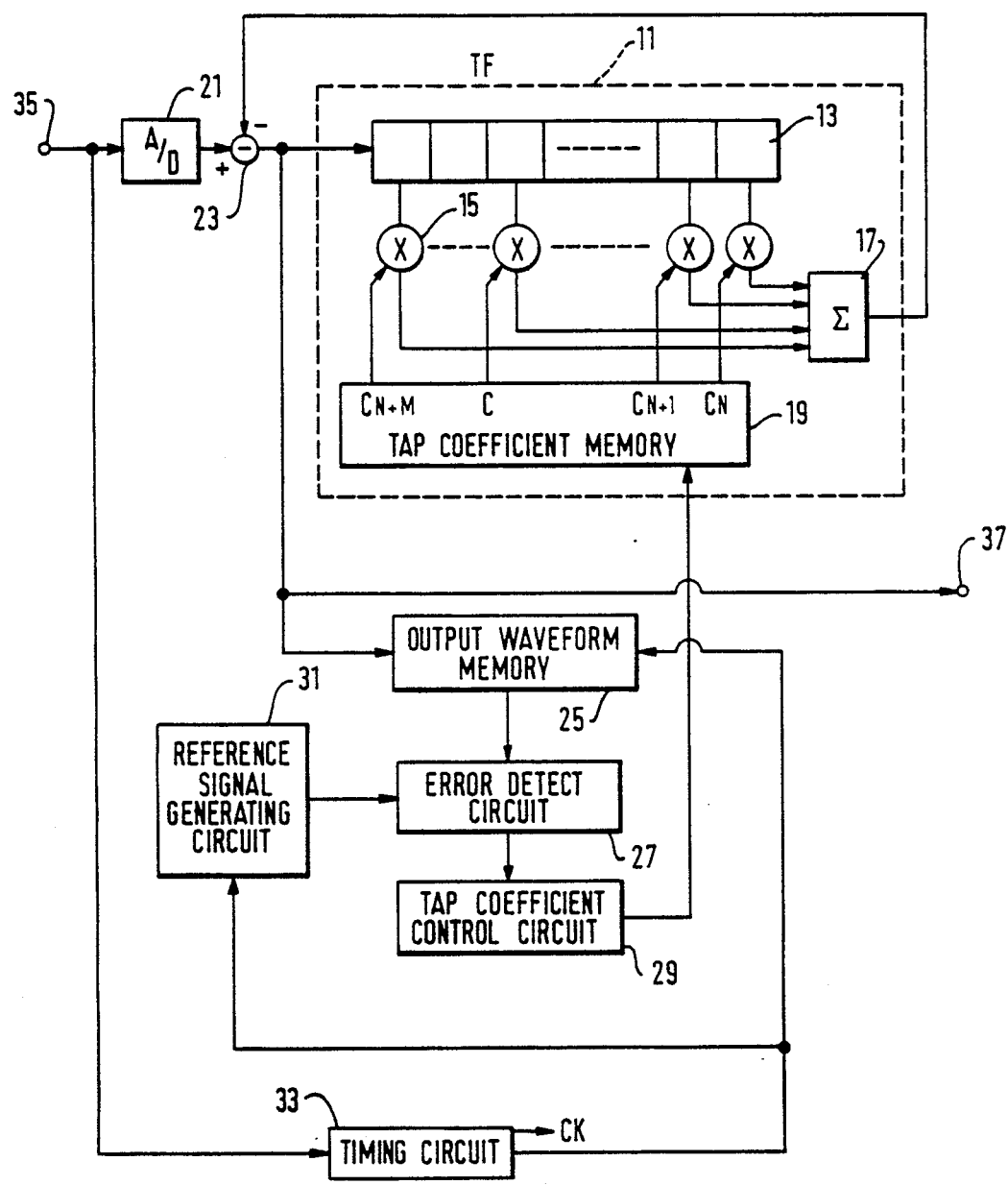
FIG. 1 is a basic block diagram of the ghost cancelling system according to the present invention.

In an exemplary embodiment of the present invention, as illustrated in FIG. 1, there is provided a ghost cancelling system. The ghost cancelling system includes a TF 11, an analogue/digital conversion circuit (hereafter, A/D conversion circuit) 21, a subtractor 23, an output waveform memory 25, an error detect circuit 27, a tap coefficient control circuit 29, a reference signal generating circuit 31 and a timing circuit 33. The TF 11 includes a plurality of tapped delay lines 13, coefficient circuits 15 correspond to the tapped delay lines 13, an adder 17 and a tap coefficient memory 19. The A/D conversion circuit 21 is connected to an input terminal 35 of the ghost cancelling system and receives a video signal containing a vertical synchronization cyclic reference signal. The video signal inputted from the input terminal 35 is applied to the subtractor 23 after being converted to a digital signal by the A/D conversion circuit 21. The output of the subtractor 23 is supplied to the TF 11. The TF 11 generates a ghost cancelling signal using the output of the subtractor 23. In other words, the system shown in FIG. 1 is designed as a feed-back construction ghost cancelling system. Specifically, the output of the subtractor 23 which is supplied to TF 11 is successively delayed every cycle T by the tapped delay line 13. Here, T is, for instance, set at ¼ fsc (=70 nsc). (fsc is the color sub-carrier wave frequency of 3.579545 MHz). Each delayed output is added in the adder 17 after the tap coefficients ($C_N - C_{N+M}$) have been supplied by the coefficient circuit 15 connected to the corresponding tap. The output of adder circuit 15 is supplied to the subtractor 23 as the ghost cancelling signal. The tap coefficients are kept in the tap coefficient memory 19 of the TF 11. These tap coefficients are corrected by the tap coefficient control circuit 29, based on a reference signal. Specifically, the output from the subtractor 23 is supplied to the output waveform memory 25 and an output terminal 37. The output waveform memory 25 outputs the signal which may including a ghost to the error detect circuit 27 in accordance with a timing signal from the timing circuit 33. On the other hand, the reference signal which is used for ghost cancelling is applied to the error detect circuit 27 from the reference signal generating circuit 31. The timing circuit 33 outputs cycle T clocks CK, for driving the A/D conversion circuit 21 and the tapped delay line 13. The timing circuit 33 also outputs timing signals for inputting the reference signal to the reference signal generating circuit 31, based on video signals supplied to the input terminal 35. The error detect circuit 37 compares the output waveform with the reference signal, and outputs the result to the tap coefficient control circuit 29. Upon receiving the error information (data), the tap coefficient control circuit 29 controls the tap coefficient of each tap, for reducing the ghost signal more and more. Thus, the new information (data) is supplied to the tap coefficient memory 19. As a result, although a video signal containing a ghost is obtained from the subtractor 23 at the beginning of the waveform equalizing process (ghost cancelling process), a ghost-cancelled video signal can be obtained in the final stage of the waveform equalizing process.

Figure 2:
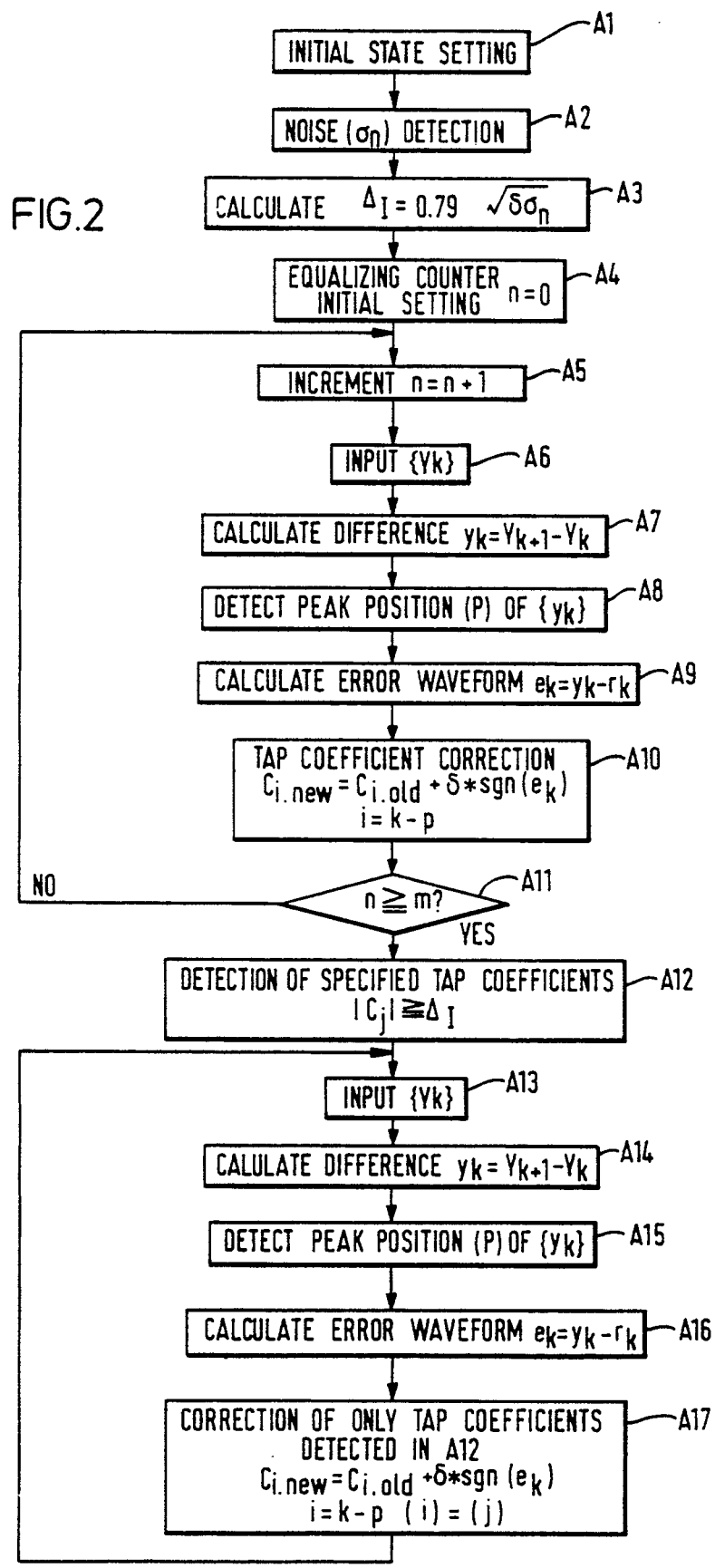
FIG. 2 is a flow-chart showing the operating sequence of the ghost cancelling system shown in FIG. 1.

The tap coefficient correction operation is described with reference to FIG. 2. In FIG. 2, step A1 is the initial step of inputting the electric power and channel changing by the user. Furthermore, there are such processes as setting to 0 the tap coefficients held in the tap coefficient memory 19. When this initial setting is completed, the noise included in the video signal, or more precisely, the r.m.s. value ($\sigma_n$) of the noise signal is detected in step A2. Noise detection is performed by means of conventional operations. In the next step, A3, a specified value $\Delta_I$ is calculated. The value is used in step A12, as explained below. For this specified value $\Delta_I$, the r.m.s. value ($\sigma_{TAP}$) of the fluctuation of the tap coefficient in the so-called incremental control method is used. For example, the $\sigma_{TAP}$ is given by equation (1) below, as proposed in "A Novel Automatic Ghost Canceller", IEEE Trans. on CE. vol. CE-26, No. 3, Aug. 1980, by Makino et al.

$$\Delta_I = \sigma_{TAP} = 0.79 \sqrt{\delta \sigma_n} \tag{1}$$

Here, $\delta$ is the tap coefficient correction and a positive minute amount of correction. In general, the value of correction $\delta$ is determined in response to the noise $\sigma_n$ obtained in step A2.

In step A4, the initial setting of a equalizing counter for counting the number of waveform equalization steps is performed. In the next step, A5, the value of the equalizing counter is increased by just one, prior to commencement of the waveform equalizing process. A waveform equalizing loop consisting of step A6–A10 is executed in a following manner. Specifically, in step A6, the waveform equalizing reference signal contained in the output of the TF 11 through the subtractor 23, is inputted to the output waveform memory 25. This inputted signal is expressed as $\{Y_k\}$. Currently for instance, the falling portion of the vertical synchronizing signal or a GCR signal (Ghost Cancel Reference signal) which is inserted in the vertical blanking period is frequently used as the reference signal for waveform equalization. For this GCR signal, although various signals can be considered, basically a step waveform signal is used. In the next step, A7, a difference signal $\{y_k\}$ for the T seconds interval defined by equation (2) below is found by reading inputted signal $\{Y_k\}$ from the output waveform memory 25.

$$y_k = Y_{k+1} - Y_k \tag{2}$$

In the following step, A8, the maximum peak position (p) of difference signal $\{y_k\}$ is detected. That is to say, $y_p$ becomes the impulse peak of the main signal which is the strongest in signal level and is not polluted by the ghost. In the next step, A9, an error signal $\{e_k\}$, which is defined in equation (3) below, is found by matching peak position (p) obtained in step A8, and subtracting the reference signal $\{r_k\}$ from the difference signal $\{y_k\}$.

$$e_k = y_k - r_k \tag{3}$$

In step A10, the tap coefficient is corrected, based on the incremental control method shown in equation (4) below.

$$C_{i,new} = C_{i,old} + \delta \times \text{sgn} \{e_k\} \tag{4}$$

Here,
$i = k - p$
$i = N \sim N + M$
Here, the suffix i of the tap coefficient $\{C_i\}$ indicates the tap for cancelling the ghost of delay time iT seconds, and new and old indicate "before correction" and "after correction", respectively. In step A11, it is judged whether or not the tap coefficients have been corrected the specified number of times m. This judgement is made by comparison between the count value n of the above-mentioned equalizing counter and m. If the count value n has not reached to the specified number of times m, the waveform equalizing process is re-executed from the step A5. On the other hand, if the specified number of times m has been reached, the process moves on to step A12. Incidentally, if the increment process in step A5 may be inserted anywhere in the waveform equalizing loop.

In general, when the reference signal contains a noise signal, the noise signal will also be included in the error signal $\{e_k\}$ given by equation (3). When the correction process for the tap coefficients, shown in equation (4), is executed, using error signals $\{e_k\}$ which include noise signals, the tap coefficients will fluctuate randomly due to the randomness of the noise signals. The mean value of this fluctuation is the value when there is no noise signal, and its dispersion becomes a normal distribution which depends on the noise $\sigma_n$. This fluctuation will occur not only in the ghost cancelling tap coefficients, but also in all the tap coefficients such as described in above-mentioned "A Novel Automatic Ghost Canceller" by Makino et al. In step A12, the detection of the tap coefficients with absolute values $|C_j|$—equal to or greater than the specified value $\Delta_I$ is performed in accordance with the following equation (5). Then, the data indicating the position columns $\{j\}$ of the detected tap coefficients $\{C_j\}$ are stored in a memory (not shown).

$$|C_j| \geq \Delta_I \tag{5}$$

Figure 3:
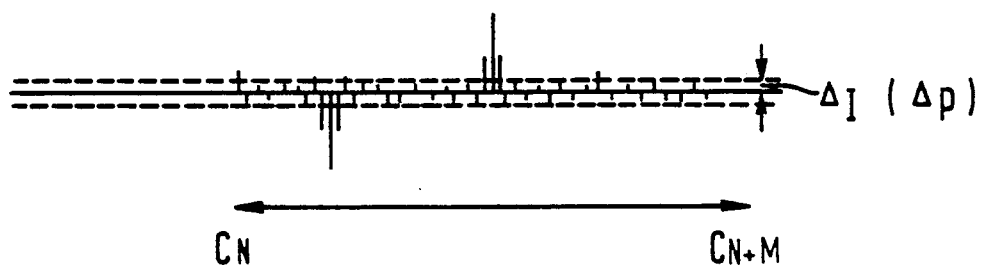
FIGS. 3 and 4 are signal waveform diagrams explaining the operation of the system shown in FIG. 1.
Figure 4:
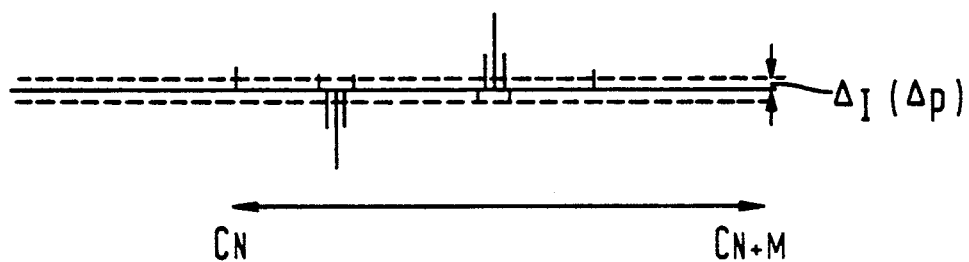

For example, if the tap coefficients obtained by the equalizing process in steps A6 to A10 are taken as those shown in FIG. 3, the tap coefficients detected by the process in step A12 will be as shown in FIG. 4. Approximately 68% of the tap coefficients generated by the noise signals are cancelled by this detection process. Needless to say, if specified value $\Delta_I$ is set at a greater value than $\sigma_{TAP}$, even more of the tap coefficients generated by the noise signals can be removed. For instance, if the setting is $\Delta_I = 2\sigma_{TAP}$, approximately 95% of the tap coefficients can be cancelled. Also, if the setting is $\Delta_I = 3\sigma_{TAP}$, approximately 99.7% of the tap coefficients can be cancelled. However, if specified value $\Delta_I$ is made too large, the tap coefficients generated based on the ghosts also will not be detected. Thus, it is necessary to set the size of the specified value $\Delta_I$ within limits in which the tap coefficients generated based on the ghosts can be accurately detected.

In steps A13 through A17, based on position columns $\{j\}$ which are detected in step A12, the tap coefficients $\{C_j\}$, whose absolute values $|C_j|$ are equal to or greater than the specified value $\Delta_I$, are executed in an equalizing process. Thus, the correction is executed only on the tap coefficients shown in FIG. 4, and the minute tap coefficients which produce the gentle waveform changes are not corrected. In step A17, the correction equation for executing the tap coefficient correction is the same as the correction equation in step A10. When the process in step A17 is performed, the waveform equalizing process is reexecuted from the step A13.

Accordingly, with this type of construction, correction of the minute tap coefficients which produce the gentle waveform changes is not carried out after the waveform equalizing process has reached equilibrium, that is to say, the ghosts are almost cancelled. As a result, it is possible to reduce flickering low band fluctuation. Also, since only the tap coefficients directly related to ghost cancelling are corrected, it is possible to follow-up fluctuation in the polarity and level of the ghosts, e.g., due to the changes in weather.

Figure 5:
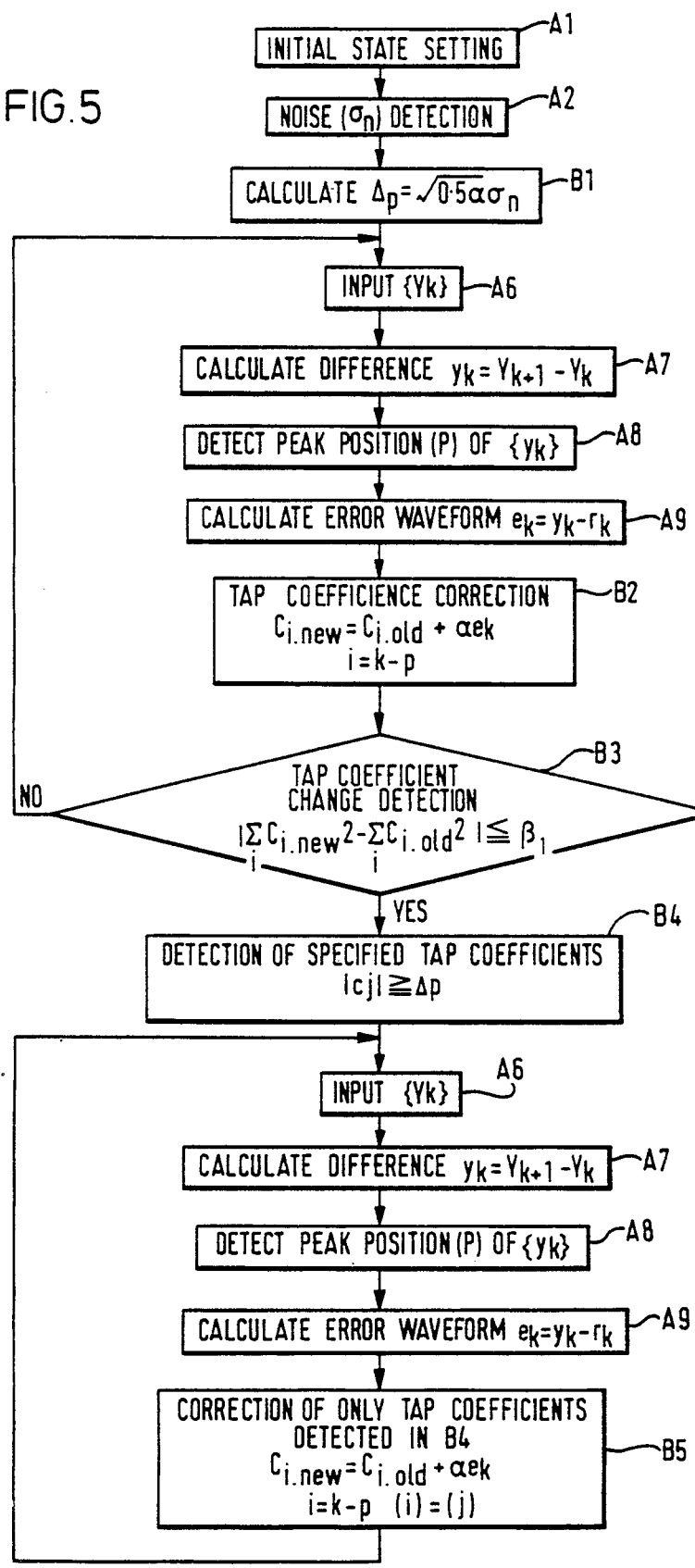
FIG. 5 is a flow-chart showing the other operating sequence of the ghost cancelling system shown in FIG. 1.

The flow-chart of FIG. 5 executes ghost cancelling in a different manner. In FIG. 5, steps which are the same as in FIG. 2 above, have been given the same symbols. Therefore, the detailed description thereof is not repeated.

When comparing this embodiment with the previous embodiment, the method of finding a specified value $\Delta_p$ for the tap coefficients which occur due to the influence of noise signals, the method of correcting the tap coefficients, and the method of detecting that the waveform equalizing process has reached equilibrium are all different. In FIG. 5, the specified value $\Delta_p$ is obtained in accordance with the following equation (6), as proposed in "A Novel Automatic Ghost Canceller" by Makino et al. above mentioned.

$$\Delta_p = \sqrt{0.5\alpha} \times \sigma_n \tag{6}$$

The correction of tap coefficients is executed in step B2 before the waveform equalizing process has reached equilibrium. After equilibrium has been reached, the correction is again executed in step B5. In this embodiment, the correction is executed on so-called the proportional control method shown in following equation (7).

$$C_{i,new} = C_{i,old} + \alpha e_k \tag{7}$$

Here, $i = k - p$ and $i = N \sim N + M$.

Here, $\alpha$ is a positive minute correction. The judgment of whether or not the waveform equalizing process has reached equilibrium is carried out in step B3. In this embodiment, that judgment is based on the change in the tap coefficients. After having corrected the tap coefficients in step B2, the difference in the sums of squares of the respective new and old coefficients $C_{i,new}$ and $C_{i,old}$ are found. Farthermore, the sizes of those absolute values are compared with specified value $\beta_1$, as shown in equation (8) below.

$$\left| \sum_i C_{i,new}^2 - \sum_i C_{i,old}^2 \right| \leq \beta_1 \tag{8}$$

Here, $\beta_1$ is set as a design matter. When the absolute values are greater than specified value $\beta_1$, it is judged that equilibrium has not been reached. Thus, the waveform equalizing process is re-executed by returning to step A6. On the other hand, when the absolute value is equal to or less than specified value $\beta_1$, it is judged that equilibrium has been reached. Thus, moving on to step B4, where the detection of tap coefficients $\{C_j\}$ with absolute values equal to or greater than specified value $\Delta_p$ is executed. After this, the correction of only those tap coefficients is executed in accordance with equation (7).

In this embodiment as described in detail above, needless to say, the same results as in the previous embodiment can be obtained, but since the state of equilibrium is based on the changes in tap coefficients, the state of equilibrium can be judged more accurately than in the previous embodiment.

Judging whether or not the waveform equalizing process has reached equilibrium based on the changes in tap coefficients may be done by finding the difference of the sums of the respective absolute values of the new and old tap coefficients $C_{i,new}$ and $C_{i,old}$. Further, it may be done by comparing the sizes of those absolute values with specified value $\beta_2$, as shown in equation (9) below.

$$\left| \sum_i |C_{i,new}| - \sum_i |C_{i,old}| \right| \leq \beta_2 \quad (9)$$

In this case, it is possible to make the operating process simpler than in the case of finding the sums of the squares.

Figure 6:
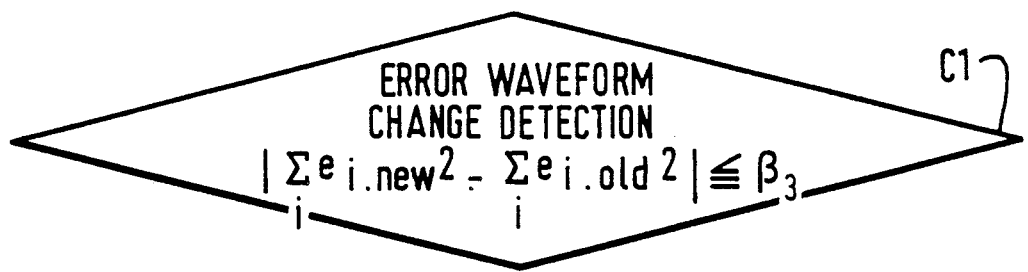
FIG. 6 is a diagram showing the essential part of a third embodiment of the invention.

FIG. 6 is a diagram showing an extract of a part of the flow-chart showing the operating sequence of a third embodiment of this invention. This embodiment is designed to judge whether or not the waveform equalizing process has reached equilibrium based on the changes in the error signals $\{e_k\}$. C1 in FIG. 6 shows this judgement process step. The step C1 is inserted in the steps A6 through A10 waveform equalizing loop in place of steps A5 and A6 in FIG. 2, and is inserted in place of step B in FIG. 5.

In step C1, the differences in the sums of the squares of the respective new and old error signals $e_{i,new}$ and $e_{i,old}$ are found. Furthermore, the sizes of those absolute values are compared with specified value $\beta_3$, as shown in equation (10) below.

$$\left| \sum_i e_{i,new}^2 - \sum_i e_{i,old}^2 \right| \leq \beta_3 \quad (10)$$

When the absolute value is larger than specified value $\beta_3$, it is judged that equilibrium has not been reached, and the waveform equalizing process is executed once more. On the other hand, when the absolute value is equal to or less than specified value $\beta_3$, it is judged that equilibrium has been reached, and detection of those tap coefficients $\{C_j\}$ whose absolute values are greater than the specified value is executed.

Judging whether or not the waveform equalizing process has reached equilibrium based on the changes of error signals $\{e_k\}$, may be done by finding the differences of the sums of the respective absolute values of the new and old error signals $e_{i,new}$ and $e_{i,old}$. Further, it may be done by comparing the sizes of the absolute values of the differences with a specified value $\beta_4$ (see equation (11) below).

$$\left| \sum_i |e_{i,new}| - \sum_i |e_{i,old}| \right| \leq \beta_4 \quad (11)$$

These embodiment are designed to detect tap coefficients above a specified level when the waveform equalizing process for ghost cancelling has reached equilibrium. Thus, the correction of only those tap coefficients is executed. As a result, flickering low band fluctuation due to the influence of noise signals can be reduced. At the same time, ghosts can be cancelled by following-up the fluctuations of the polarities and levels of the ghosts.

Numerous other modifications and variations of the present invention are possible in light of the above teachings. It is therefore to be understood that, within the scope of the appended claims, the present invention can be practiced in a manner other than as specifically described herein.

For instance, as a tap coefficient correction, this invention can also be applied to ghost cancelling systems which adopt the correlation technique for ghost cancellation.

What is claimed is:

1. A ghost canceling system comprising:
   a transversal filter having a plurality of taps which coefficients are adjustable;
   a subtractor which subtracts an output signal of said transversal filter from an input video signal, including a ghost signal and a vertical synchronization cyclic reference signal, and outputs the result of the subtraction operation to said transversal filter;
   a memory means for maintaining the waveform of an output from said subtractor;
   an error detection means for comparing said output waveform from said subtractor maintained in said memory means and a reference signal; and
   control means for controlling the correction of said tap coefficients in response to an output from said error detection means;
   wherein said control means judges whether an equilibrium condition exists wherein said ghost signal has been substantially canceled from said video signal, corrects each tap coefficient in response to a detected result of said error detection means until the equilibrium condition is reached, but corrects only said tap coefficients which have absolute values equal to or greater than a specified value after the equilibrium condition is reached.

2. A system according to claim 1, further including an analogue/digital conversion circuit for converting said input video signal into a digital signal and supplying said converted signal to said subtractor.

3. A system according to claim 1, further including a timing circuit for supplying a timing signal to said memory means, which outputs said waveform from said subtractor to said error detection means when the timing signal is received.

4. A system according to claim 1, further including a reference signal generating circuit for generating said reference signal which is compared with an output signal from said memory means.

5. A system according to claim 1, wherein said control means further calculates said specified value, which value depends on a noise signal included in said input video signal.

6. A system according to claim 1, wherein said control means judges whether the equilibrium condition exists by determining if said tap coefficients have been corrected with a specified number of times.

7. A system according to claim 1, wherein said control means judges whether the equilibrium condition exists by the difference between the sums of the squares of said respective new tap coefficients and the sums of the squares of said respective old tap coefficients.

8. A system according to claim 1, wherein said control means judges whether the equilibrium condition exists by the difference between the sums of the absolute values of said respective new tap coefficients and the sums of the absolute values of said respective old tap coefficients.

9. A system according to claim 1, wherein said control means judges whether the equilibrium condition exists by the difference between a new error signal and an old error signal, wherein the error signal is defined as a difference between said reference signal and a difference signal, with the difference signal being defined as the difference in the outputs of said subtractor for a specified interval.

10. A system according to claim 9, wherein said difference between the new error signal and the old error signal is defined by the sums of the squares of said respective new and old error signals.

11. A system according to claim 9, wherein said difference between the new error signal and the old error signal is defined by the sums of the absolute values of said respective new and old error signals.

12. A system according to claim 1, wherein said control means corrects said tap coefficients by a specified amount which depends on a noise signal contained in said input video signal.

13. A system according to claim 12, wherein said control means corrects said tap coefficients incrementally.

14. A system according to claim 12, wherein said control means corrects said tap coefficients proportionally.

15. A method for controlling a ghost canceling system including a transversal filter connected to receive an input video signal including ghost signals and a vertical synchronization cyclic reference signal, the method including the steps of:
- canceling said ghost signal from said input video signal using said transversal filter;
- detecting an error signal between said reference signal included in said canceled signal and pre-stored reference signal;
- distinguishing whether an equilibrium condition exists wherein ghost signals have been substantially eliminated from a signal passed through said transversal filter;
- calculating a specified value which depends on a noise signal contained in said video signal;
- detecting the tap coefficients which have absolute values equal to or greater than said specified value; and
- correcting said each tap coefficient in response to said detected error signal until said equilibrium condition is reached, but correcting only said detected tap coefficients.

* * * * *